(12) United States Patent
Gasworth

(10) Patent No.: US 10,344,384 B2
(45) Date of Patent: Jul. 9, 2019

(54) METHOD OF USING A MULTI-PASS VACUUM COATING SYSTEM

(71) Applicant: EXATEC LLC, Wixom, MI (US)

(72) Inventor: Steven Marc Gasworth, Wixom, MI (US)

(73) Assignee: EXATEC, LLC, Wixom, MI (US)

( * ) Notice: Subject to any disclaimer, the term of this patent is extended or adjusted under 35 U.S.C. 154(b) by 431 days.

(21) Appl. No.: 15/255,988

(22) Filed: Sep. 2, 2016

(65) Prior Publication Data

US 2016/0369403 A1 Dec. 22, 2016

Related U.S. Application Data

(62) Division of application No. 12/345,155, filed on Dec. 29, 2008.

(Continued)

(51) Int. Cl.
*C23C 16/02* (2006.01)
*C23C 16/50* (2006.01)
(Continued)

(52) U.S. Cl.
CPC ............ *C23C 16/50* (2013.01); *C23C 14/568* (2013.01); *C23C 16/4408* (2013.01);
(Continued)

(58) Field of Classification Search
CPC . C23C 16/02; C23C 16/0209; C23C 16/0272; C23C 16/45519; C23C 16/50
See application file for complete search history.

(56) References Cited

U.S. PATENT DOCUMENTS 5,340,454 A * 8/1994 Schaefer ............... C23C 14/568
204/192.12
5,991,081 A * 11/1999 Haaland ............... C03C 17/225
359/580

(Continued)

FOREIGN PATENT DOCUMENTS

CN 101012547 A 8/2007
EP 0800203 A2 10/1997
(Continued)

OTHER PUBLICATIONS

Angeline Poulon-Quintin, Cyril Faure, Lionel Teulé-Gay, Jean Pierre Manaud. A multilayer innovative solution to improve the adhesion of nanocrystalline diamond coatings. Applied Surface Science, Elsevier, 2015, 331, pp. 27-34.*

(Continued)

*Primary Examiner* — Bret P Chen
(74) *Attorney, Agent, or Firm* — Cantor Colburn LLP

(57) ABSTRACT

A method for coating substrates with multiple coating layers can comprise: establishing a sub-atmospheric pressure within a coating system; transferring each substrate from outside the coating system to inside the coating system though a transfer lock; heating each substrate in a heating zone before entering a coating zone; traversing the coating zone in a first direction of movement and applying a first coating layer to each substrate in the coating zone using expanding thermal plasma type of plasma enhanced chemical vapor deposition; traversing the coating zone a second time and applying a second coating layer to each substrate in the coating zone using expanding thermal plasma type of plasma enhanced chemical vapor deposition; determining if the coating zone is occupied or vacant; if the coating zone is vacant, purging a heater zone module with inert gas; and (Continued)

pumping the inert gas out of the coating zone through ports located in the coating zone.

13 Claims, 6 Drawing Sheets

Related U.S. Application Data

(60) Provisional application No. 61/016,873, filed on Dec. 27, 2007.

(51) Int. Cl.
| | | |
|---|---|---|
| *C23C 14/56* | (2006.01) | |
| *C23C 16/54* | (2006.01) | |
| *H01L 21/67* | (2006.01) | |
| *H01L 21/677* | (2006.01) | |
| *C23C 16/44* | (2006.01) | |
| *H01J 37/32* | (2006.01) | |

(52) U.S. Cl.
CPC .......... *C23C 16/4409* (2013.01); *C23C 16/54* (2013.01); *H01J 37/32743* (2013.01); *H01J 37/32752* (2013.01); *H01J 37/32816* (2013.01); *H01L 21/67173* (2013.01); *H01L 21/67745* (2013.01); *H01J 2237/3321* (2013.01)

(56) References Cited

U.S. PATENT DOCUMENTS

| | | | |
|---|---|---|---|
| 5,993,614 A | 11/1999 | Nomura | |
| 6,039,811 A | 3/2000 | Park et al. | |
| 6,397,776 B1 | 6/2002 | Yang et al. | |
| 6,872,428 B2 | 3/2005 | Yang et al. | |
| 7,407,358 B2 | 8/2008 | Takahashi | |
| 7,645,492 B2 | 1/2010 | Gasworth | |
| 2003/0024920 A1* | 2/2003 | Ratliff ................... | C23C 16/455 219/390 |
| 2003/0044539 A1 | 3/2003 | Oswald | |
| 2003/0224232 A1* | 12/2003 | Browall ............... | H01M 4/8621 429/496 |
| 2004/0018305 A1 | 1/2004 | Pagano et al. | |
| 2004/0258726 A1* | 12/2004 | Stupp ..................... | A61L 27/32 424/423 |
| 2005/0202259 A1 | 9/2005 | Korevaar et al. | |
| 2006/0070877 A1* | 4/2006 | Tilsch ............... | H01J 37/32541 204/298.27 |
| 2006/0180197 A1* | 8/2006 | Gui ..................... | H01G 9/2031 136/255 |
| 2007/0015034 A1* | 1/2007 | Vyas ................... | H01M 8/0206 429/522 |
| 2007/0137793 A1 | 6/2007 | Lee et al. | |
| 2007/0215596 A1* | 9/2007 | Wintenberger ....... | H01L 21/324 219/406 |
| 2008/0128871 A1* | 6/2008 | Schropp ................ | C23C 16/345 257/649 |
| 2008/0265459 A1* | 10/2008 | Gasworth ........... | B29C 45/0053 264/255 |
| 2009/0042054 A1* | 2/2009 | Bewlay ..................... | C21D 1/09 428/615 |
| 2009/0169751 A1 | 7/2009 | Gasworth | |
| 2011/0250367 A1* | 10/2011 | Neal ....................... | C23C 14/02 427/596 |

FOREIGN PATENT DOCUMENTS

| | | | | |
|---|---|---|---|---|
| EP | 1098353 A2 | 5/2001 | | |
| GB | 2154614 A | * 9/1985 | ............... | C23C 4/18 |
| JP | 11200035 A | 7/1999 | | |
| JP | 2006118008 A | 5/2006 | | |
| WO | 2009086494 A2 | 7/2009 | | |

OTHER PUBLICATIONS

Chi, Shyang-ho, et al., "Cracking in coating-substrate composites with multi-layered and FGM coatings". Engineering Fracture Mechanics 70 (2003) 1227-1243.*

Grigoriev, Sergey N., et al., "Methodology of formation of multi-layered coatings for carbide cutting tools". Mechanics & Industry 17, 706 (2016) pp. 1-14.*

Asghar, M.H., et al., "Modeling high performance multilayer antireflection coatings for visible and infrared (3-5um) substrates". Semiconductor Physics, Quantum Electronics & Optpelectronics, 2003 vol. 6, No. 4, pp. 508-513.*

CN101012547 A; Date of Publication Aug. 8, 2007; 1 page; English Abstract.

Hoffman et al.; "Handbook of Vacuum Science and Technology"; Academic Press, Copyright: 1998; 4 Pages.

International Search Report; International Application No. PCT/US2008/088392; International Filing Date: Dec. 29, 2008; dated Aug. 3, 2009; 7 Pages.

Japanese Patent No. 11200035 (A); Publication Date: Jul. 27, 1999; Abstract Only; 2 Pages.

Japanese Patent No. 2006118008 (A); Publication Date: May 11, 2006; Abstract Only; 2 Pages.

Kukla et al.; "Overview on Modern Vacuum Web Coating Technology"; Surface and Coatings Technology; vols. 86-87; 1996; pp. 753-761.

Written Opinion of the International Search Report; International Application No. PCT/US2008/088392; International Filing Date: Dec. 29, 2008; dated Aug. 3, 2009; 7 Pages.

* cited by examiner

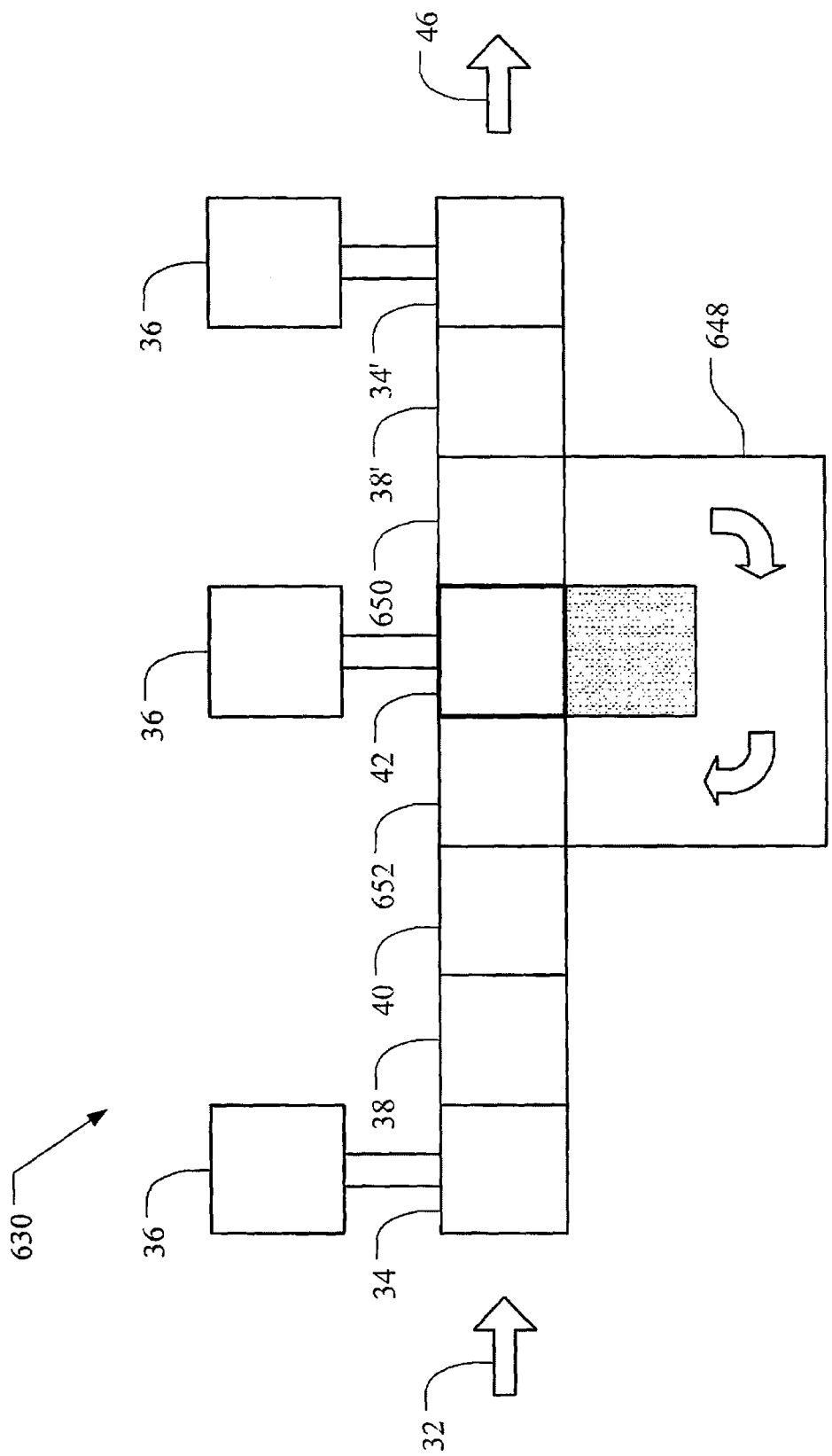

METHOD OF USING A MULTI-PASS VACUUM COATING SYSTEM

CROSS REFERENCE TO RELATED APPLICATIONS

The present application is a divisional of U.S. patent application Ser. No. 12/345,155, filed Dec. 29, 2008, which claims priority to U.S. Provisional Application Ser. No. 61/016,873 and filed on Dec. 27, 2007, the contents of which are incorporated hereby in reference.

BACKGROUND

1. Field of the Invention

The present invention generally relates to coating systems. More specifically, the present invention relates to a multi-pass coating system that applies coating layers via a deposition process.

2. Description of Related Technology

Plastic substrates may be coated at sub-atmospheric pressures using chemical vapor deposition systems and particularly Plasma Enhanced Chemical Vapor Deposition (PECVD) systems, such as the Expanding Thermal Plasma (ETP) coating systems illustrated and described in FIGS. 9 & 10 of U.S. Pat. Nos. 6,397,776 and 6,872,428. In such vacuum coating systems, plasma sources or generators are provided as an array within a vacuum chamber that houses one or more coating zones. These plasma sources may be arranged in vertical arrays having heights that correspond to the height of the substrate that is to be coated in the coating system. During the deposition of a coating layer, typically, a series of substrates is sequentially moved through a heating zone and a coating zone or a succession of coating zones. If multiple coating layers or a coating layer having multiple sub-layers are to be provided on the substrate, a separate coating zone is typically required for each layer or sub-layer.

A vacuum coating system with substrates moving continuously and successively in a single direction, along a common path, via a carrier or transport mechanism, is called a continuous, in-line vacuum coating system. Transfer locks, located both prior to the first coating zone, and after the last coating zone, are used to actively transfer substrates and carriers from outside (e.g., at atmospheric pressure) to inside the vacuum coating system, which is at a sub-atmospheric pressure, and then back again to outside the vacuum coating system. A continuous, in-line vacuum coating system, with its series of closely-spaced substrate carriers that traverses a succession of coating zones, each applying a specific coating layer or sub-layer to the substrates, provides the highest possible annual through-put capacity and thereby exhibits the lowest expected capital investment per unit of capacity.

In some situations, however, the demand for coated substrates may be insufficient to fully use the available capacity of a continuous, in-line vacuum coating system. Examples of such situations include 1) the initial start-up of a new vacuum coating system and 2) the coating of substrates having a market of limited need, a niche market.

The required investment associated with each plasma source in a vacuum coating system reflects costs contributed by the required power supply and the number of mass flow controllers, vacuum pumps, and the mechanical components that comprise the plasma source itself. It is possible to reduce the overall investment by decreasing the number of plasma sources (uniformly across all of the arrays) resulting in a uniform reduction in the active height of the arrays. This approach has the advantage of later allowing relatively rapid expansion to full height arrays and full capacity. The disadvantages of this approach include the correspondingly reduced range of part heights that can be coated and the modest (significantly less than 50%) potential reduction in required investment. While also reducing the height of the coating system's infrastructure (transfer locks and vacuum chamber) would further reduce investment, this would forgo the expansion advantages mentioned above.

A vacuum coating system that could be initially configured to provide a reduced capacity, but which is capable of being readily modified to increase its capacity when necessary, would be desirable in order to limit the initial monetary investment required to build, install, and operate the vacuum coating system.

SUMMARY

The current invention provides an alternative to continuous, in-line vacuum coating systems and offers a means to coat plastic substrates at sub-atmospheric pressures, at reduced initial investment, while allowing for increases in the overall coating capacity of the system, when necessary, at minimum cost. The vacuum coating system of the present invention thus allows for the continued use of the existing infrastructure and components in a coating system, rather than requiring their wholesale replacement when there is a need for incrementally increasing the system's overall coating capacity.

Accordingly, the present invention provides a multi-pass coating system and method for applying multiple coatings to substrates traversed through the system. The system includes at least one vacuum pump coupled to the system to establish a sub-atmospheric pressure within the system. The system also includes a least one coating zone where a coating layer is applied to the substrate and includes at least one transfer lock through which the substrates transition between atmospheric pressure outside the system and the sub-atmospheric pressure inside the system. To move the substrates through the system, the system includes a transport mechanism configured to move the substrates at least two times through the coating zone prior to the substrates being exited from the system.

In one aspect, the present invention provides a multi-pass coating system for applying multiple coatings to substrates traversed through the system. The system comprising: at least one vacuum pump coupled to the system to establish a sub-atmospheric pressure within the system; a plurality of zones including at least one coating zone where a coating layer is applied to the substrate; the plurality of zones also including at least one transfer lock through which the substrates transition between atmospheric pressure outside the system and the sub-atmospheric pressure inside the system; and a transport mechanism configured to move one or more substrates at least two times through the coating zone prior to the substrates exiting from the system.

In another aspect of the invention, the transport mechanism is configured to move the substrates through the coating zone in a first direction of movement followed by a reversal of the direction of movement and the moving of the substrates through the coating zone in a second direction.

In a further aspect, one of the plurality of zones further comprises a take-up module as part of the transport mechanism, with the take-up module reversing the direction of movement of the substrates within the system.

In yet a further aspect, the take-up module is configured to receive, hold and dispense multiple substrates such that multiple substrates are capable of being located within the coating system at the same time.

In another aspect, the take-up module further comprises a cassette mechanism, the cassette mechanism being configured to individually receive and hold a plurality of substrates.

In still another aspect, one of the plurality of zones comprises a heating zone module including heaters configured to regulate temperature of the substrate prior to application of a coating layer to the substrate.

In a further aspect, the transfer lock includes a take-up module as part of the transport mechanism, the take-up module reversing the direction of movement of the substrates within the system, the take-up module of the transfer lock being configured to receive, hold and dispense multiple substrates such that multiple substrates are capable of being located within the coating system at the same time.

In another aspect, the transfer lock is an intake transfer lock, the system also comprises an out-take transfer lock, the intake and out-take transfers locks respectively being configured to receive substrates in the system and to exit substrates from the system.

In yet another aspect, the plurality of zones includes a recirculation module, the recirculation module configured to route substrates exiting from the coating zone back to re-enter the coating zone for the application of an additional coating layer.

In a further aspect, the recirculation module is connected to a splitter module, the splitter module being configured to alternately direct substrates to the recirculation module or to exit the system, the recirculation module also being connected to a merge module, the merge module being configured to reintroduce substrates from the recirculation module back into a succession of substrates entering the coating zone.

In yet a further aspect, at least some of the modules have walls coupled with a cooling system, the cooling system being configured to actively cool the walls of the module so as to reduce temperature effects on substrates passing through the module.

In another aspect, the present invention provides a method for coating substrates with multiple coating layers. The method includes the steps of: establishing a sub-atmospheric pressure within the system; transferring each substrate from outside the coating system to inside the coating system though a transfer lock; heating each substrate in a heating zone to a temperature suitable for coating; traversing a coating zone in a first direction of movement and applying a first coating layer to each substrate in the coating zone; traversing the coating zone a second time and applying a second coating layer to each substrate in the coating zone; and transferring each substrate from inside the coating system to outside the system through a transfer lock.

In another aspect, the step of traversing the coating zone a second time is performed in a second direction of movement, the second direction of movement being different than the first direction of movement.

In a further aspect, the second direction of movement is opposite in direction to the first direction of movement.

In yet another aspect, the step of traversing the coating zone a second time is performed in a second direction of movement, the second direction of movement being the same as the first direction of movement.

In still another aspect, the step of traversing the coating zone a second time includes reversing the direction of movement of the substrates through the system.

In yet a further aspect, the reversing step includes receiving and holding a plurality of substrates and then dispensing the substrates in the second direction.

In a still further aspect, multiple substrates are moved through the system simultaneously.

In another aspect, the method includes the step of traversing the coating zone more than two times and applying more than two coating layers onto the substrates.

In a further aspect, the step of traversing the coating zone more than two times includes traversing the coating zone at least one time without applying a corresponding coating to the substrates.

BRIEF DESCRIPTION OF THE FIGURES

FIG. 6 illustrates a hybrid, in-line vacuum coating system according to the principles of the present invention.

DETAILED DESCRIPTION

In one aspect, the current invention pertains to an ETP coating system that can apply multiple coating layers or a coating layer comprised of multiple sub-layers. It is understood from the following description that the various vacuum coating system configurations described herein, compared with respect to configuration, capacity, and investment, are each expected to provide a substantially similar coating layers on substrates of similar size and shape. The configurations of the ETP coating systems embodied by the current invention require significantly less investment than conventional, continuous in-line ETP coating systems, with the reduced investment being achieved at the expense of capacity.

In another aspect, the present invention generically pertains to coating systems that are capable of applying coating layers or sub-layers to a substrate at sub-atmospheric pressures. One skilled-in-the-art will recognize that, although the description of the present invention may be phrased in terms of coating layers or sub-layers applied via ETP coating systems (e.g., such as the Exatec® E900 glazing by Exatec, LLC of Wixom, Mich.), the invention is generally applicable to all coatings applied to substrates at sub-atmospheric pressures. As such, vacuum coating systems embodying the present invention may not always include an ETP plasma source. It will also be appreciated that the terms "substrate" and "substrates," as used in the following description, encompass both individual substrates directly handled by the coating system's transport mechanism and substrate carriers that support one or more substrates and that are themselves (the carriers) directly handled by the coating system's transport mechanism.

Figure 1:
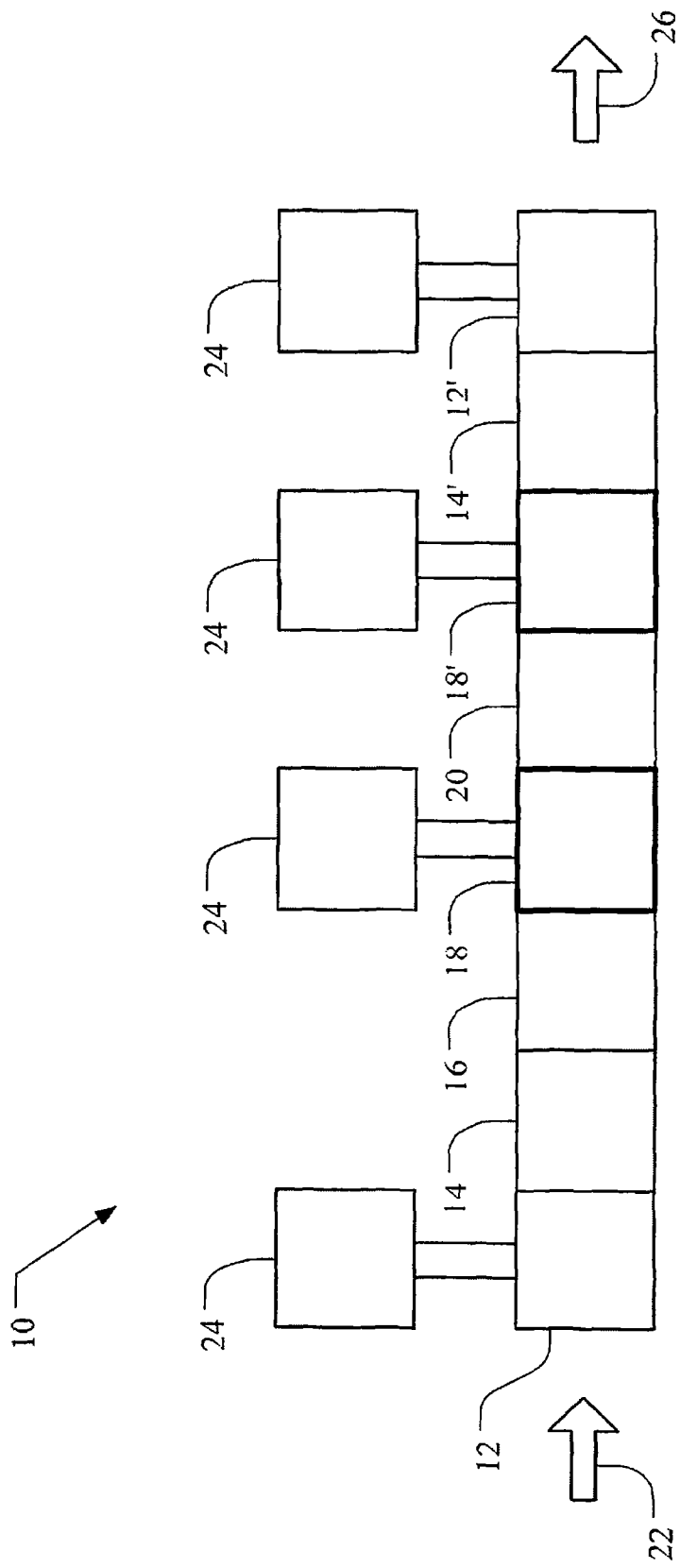
FIG. 1 illustrates a conventional, in-line, continuous coating system with two coating zones so as to be able to apply two coating layers or sub-layers.

Referring now to FIG. 1, shown therein is a continuous, in-line vacuum coating system, according to the current state of the art, which provides a high capacity of coated substrates by sustaining a series of closely-spaced substrates. The substrates are moved continuously in one direction through various coating zones, each of which is dedicated to applying a single coating layer or sub-layer onto the substrate. Such a conventional, continuous, in-line coating system is hereafter referred to as a "reference" coating system 10. As illustrated, the reference coating system 10 is configured for the application of a two-layer coating, or a coating with two sub-layers, through the use of two coating zones. Along with the two coating zones 18, the reference coating system 10 includes two transfer locks 12, various buffer zones 14, at least one heating zone 16, an isolation zone 20, each of which may be looked upon as an individual modular unit.

Substrates or carriers supporting the substrates, enter at arrow 22 into the system 10 at the intake transfer lock 12. Coupled to the intake transfer lock 12, as well as to other portions of the system 10, are one or more vacuum pumps 24 that establish a vacuum under which the system operates. From the intake transfer lock 12, a continuous succession of the substrates passes through the buffer zone 14 to the heating zone 16 where the substrates are heated to a temperature suitable for coating. From the heating zone 16, the substrates pass into the first coating zone 18 and a first layer, or sub-layer, is deposited on the substrate. Next, the substrate enters an isolation zone 20. The isolation zone 20 operates to isolate the first coating zone 18 from subsequent coating zones thereby inhibiting the intermixing and deposition of the constituents of various layers or sub-layers with one another. From the isolation zone 20, the substrate enters a second coating zone 18', where a second layer or sub-layer is deposited on top of the first. This second layer or sub-layer may be the same as or different from the previously applied layer or sub-layer. If additional layers or sub-layers are to be applied in the system 10, the system 10 would then include the appropriate number of additional isolation modules 20 and coating zones 18, the number of which would correspond to the desired number of additional layers or sub-layers. After the last layer or sub-layer is applied, the coated substrate is then transferred to a buffer zone 14' and then into the out-take transfer lock 12'. From the out-take transfer lock 12', the coated substrate is passed out of the system 10 and is transferred to any post-coating process stations, as indicated by arrow 26.

The remaining figures, FIGS. 2-6, illustrate various embodiments of coating systems that embody the principles of the present invention. Such systems differ from the reference coating system 10 in that each substrate experiences at least one reversal of direction within the system and passes through at least one coating zone for a second time. Thus, in the present invention, the substrates pass through at least one coating zone more than once. Systems embodying the present invention are therefore referred to herein as multi-pass coating systems.

Many of the modular units that comprise the infrastructure of the multi-pass coating systems described herein are similar to the modular units used in the reference coating system 10. Thus, some of the same modules could be used to construct the multi-pass coating systems embodied herein. Similarly, various modules of the present invention could be employed with the reference coating system 10.

Figure 2:
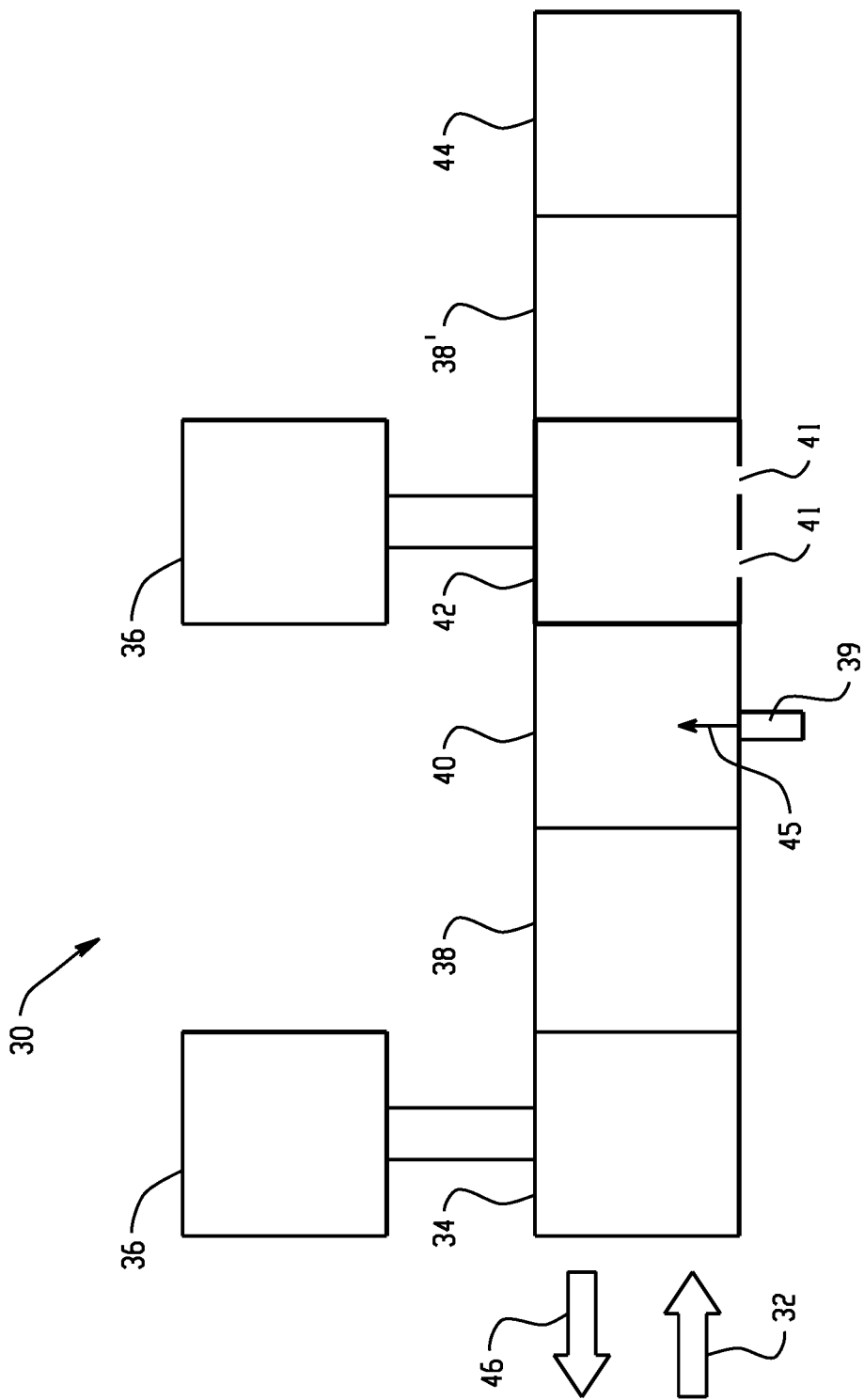
FIG. 2 illustrates a coating system embodying the principles of the present invention in which only one substrate or substrate carrier occupies the coating system at a time.
Figure 3:
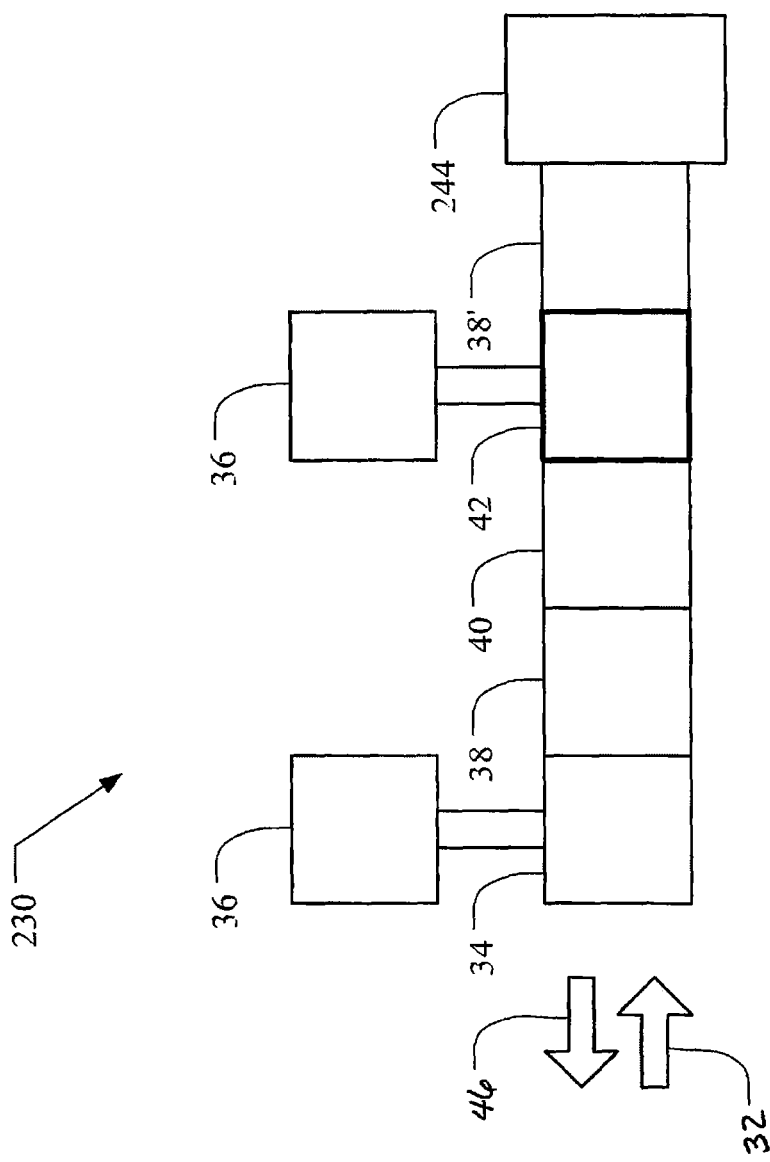
FIG. 3 illustrates a coating system embodying the principles of the present invention in which multiple substrates or substrate carriers occupy the coating system concurrently.
Figure 4:
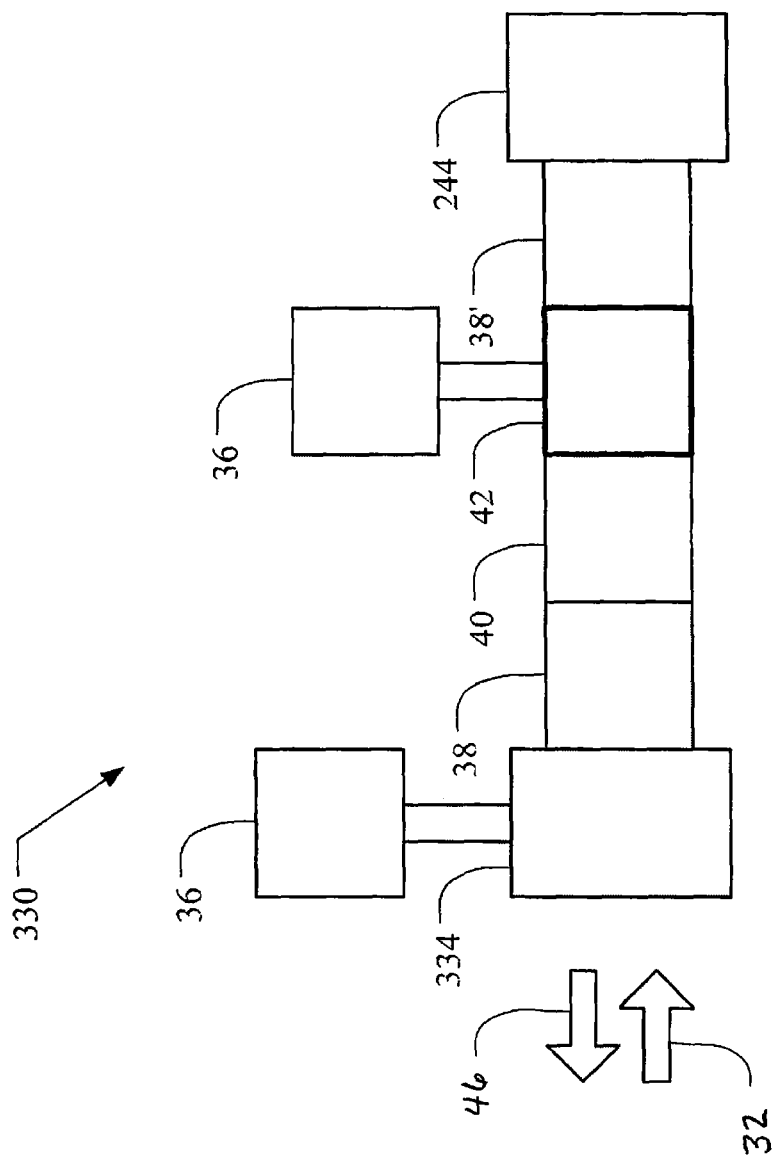
FIG. 4 illustrates a coating system embodying the principles of the present invention in which multiple substrates or substrate carriers occupy the coating system concurrently, and in which a single transfer lock is provided that can also operate as a take-up module to reverse the direction of the substrates.
Figure 5:
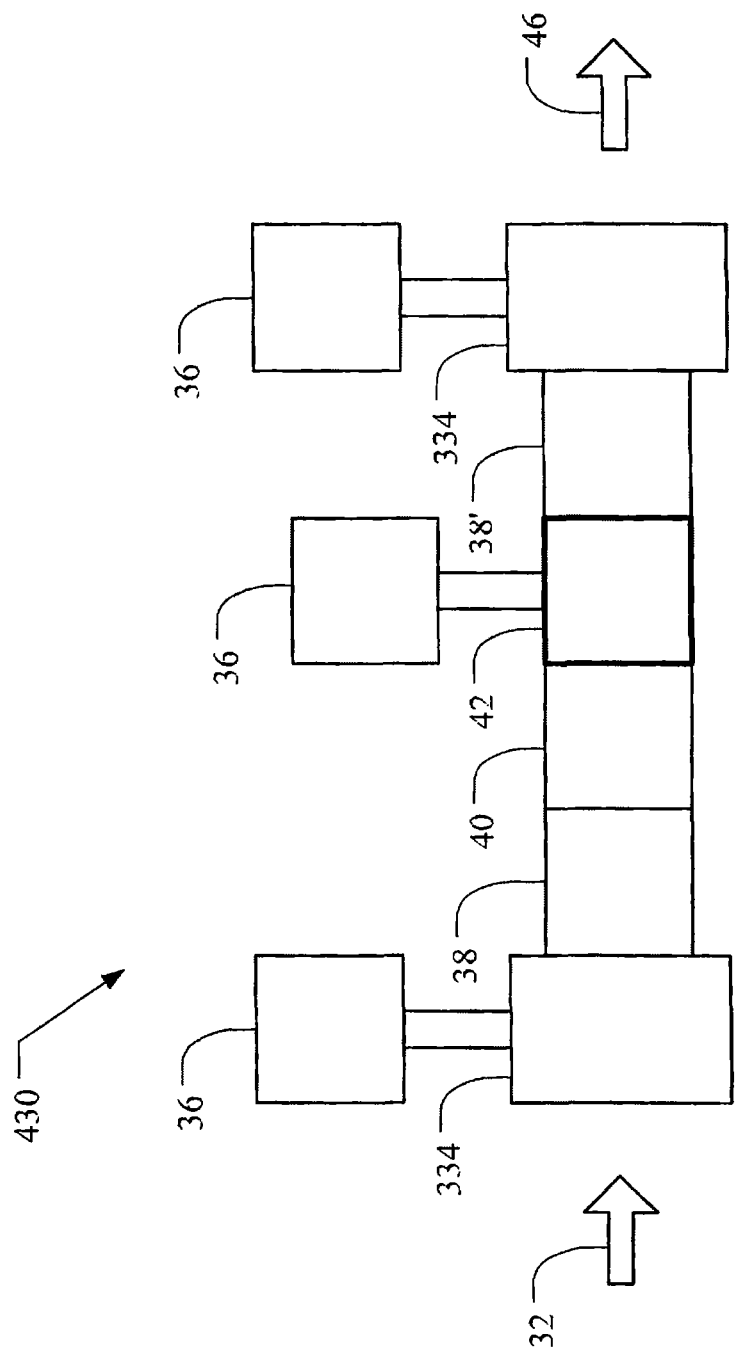
FIG. 5 illustrates a coating system embodying the principles of the present invention in which multiple substrates or substrate carriers occupy the coating system concurrently, and in which two transfer locks are provided and can serve as take-up modules to reverse the direction of the substrates.

The multi-pass coating systems according to the present invention are described in the following embodiments as including a single coating zone. However, it will be apparent from the following description that the multi-pass coating systems are configured to apply multiple coating layers or coating sub-layers, hereinafter just referred to as "layers". More specifically, the multi-pass coating systems seen in FIGS. 2 and 3 are suited for the application of two coating layers, while the multi-pass coating systems of FIGS. 4, 5 and 6 are suited for the application of more than two coating layers.

The multi-pass coating system of the present invention has a lower nominal capacity relative to the reference coating system 10, which is on account of two factors, as shown in Equation 1.

$$Cm/Cr = (Zm/SL) \times (Um/Ur) \quad \text{(Eq. 1)}$$

where,
Cm=nominal capacity of multi-pass coating system
Cr=nominal capacity of reference coating system
Zm=number of coating zones in the Multi-Pass coating system;
SL=number of layers in the coating layer;
Um=utilization of a coating zone in the Multi-Pass system; and
Ur=utilization of a coating zone in the Reference coating system.

The factor (Zm/SL) in Equation 1 recognizes that capacity is proportional to the number of available coating zones, which is (Zm) in the multi-pass coating system, and equal to (SL) in the reference coating system 10. The second factor, (Um/Ur), recognizes that capacity is also proportional to utilization of the coating zones. In other words, capacity is also proportional to the amount of time that each of the coating zones is actively coating substrates. For convenience, this utilization time is assumed to be the same for all coating zones used to apply the layers. Since a coating zone in the reference coating system 10 is fed continuously with substrates, Ur is approximately equal to the value provided by Equation 2.

$$Ur = L/(L+Gr) \quad \text{(Eq. 2)}$$

where,
L is the length of a substrate in the direction of motion; and
Gr is the gap between successive substrates.

In practical cases, Gr is made as small relative to L as the transport mechanism allows so that Ur approaches unity.

Referring now to FIG. 2, a multi-pass coating system 30 embodying the principles of the present invention is illustrated therein. The system 30 is capable of applying two coating layers, the same as the reference coating system 10 shown in FIG. 1. Capital investment, however, is less for the multi-pass coating system 30 than the reference system 10. This is because the system 30 comprises one-half as many coating zones, with their associated infrastructure, arrays of ETP sources, power supplies, mass flow controllers, etc., as the reference system 10. In addition, the multi-pass coating system 30 eliminates the isolation module 20 and two of the four sets of vacuum pumps 24 required by the reference coating system 10. Vacuum pumps 24 associated with the second coating zone 18' and with the out-take transfer lock 12' are completely eliminated by the multi-pass coating system 30.

More specifically, the multi-pass coating system 30 is configured to apply two coating layers. A substrate enters the system 30, as designated at arrow 32, either directly or via a carrier (not shown, but well known in the art), through a transfer lock 34. The transfer lock 34 is similar to that of the reference system 10 except that it operates as both an intake and an out-take transfer lock. A vacuum pump 36 is connected to the transfer lock 34 and operates to establish a vacuum within the transfer lock 34. Vacuum pumps and their use with deposition systems are well known and, as such, are not discussed in further detail herein.

From the transfer lock 34, the substrate is transported through a buffer zone 38 and then to a heating zone 40, which may be optional. The buffer zone 38 operates to allow substrates, periodically transferred through the transfer lock 34, to catch up to substrates previously transferred into the system, thus minimizing spacing between substrates (and tending to maximize utilization of the coating zone 42). In the heating zone 40, heaters, which may be any suitable type of heater known in the art, heat the substrate to a temperature suitable for coating.

In the coating zone 42, which is also preferably coupled to a vacuum pump 36, a first coating layer is deposited onto one or both sides of the substrate via conventional methods, and thus any known deposition technique, including, without limitation, chemical vapor deposition and plasma deposition techniques. From the coating zone 42, the once coated substrate traverses another buffer zone 38' and then reaches take-up module 44. Buffer zone 38' provides a staging area for periodic interaction of the substrates with the take-up module 44 and increases distance between the coating zone 42 and the substrate (while in the take-up module 44) while coating parameters are be adjusted in anticipation of a second pass of the substrate through the coating zone 42.

The take-up module 44 receives the substrate and reverses the direction of the substrate back through the system 30, beginning with passage of the substrate through the buffer zone 38'. From the buffer zone 38', the substrate passes back to the coating zone 42 for a second pass therethrough where a second coating layer is applied to one or both sides of the substrate. As noted above, the second coating layer may be the same as or different from the first coating layer.

From the coating zone 42, the substrate passes through the heating zone 40. The heating zone 40 may then be functioning at the same or a reduced temperature relative to the first pass of the substrate through the system 30. Reduced, as referenced above, may include that the heating zone 40 is in an "off" condition and not actively heating during the second pass of the substrate.

The twice coated substrate is next passed through the buffer zone 38 and back to the transfer lock 34. From the transfer lock 34, the substrate exits the system 30, as indicated by arrow 46.

In addition to consolidating the input and output operations into a single transfer lock 34, the present embodiment of the multi-pass coating system 30 also allows for loading and unloading of substrates with a single robot, instead of the two robots required by the reference coating system 10. This consolidation of loading/unloading functions in one location has the added benefit of eliminating the need for any external mechanism to return or circulate substrate carriers (if used) from the output location back to the input location of the system.

Despite the reduced number of components and/or modules, the multi-pass coating system 30 is able to apply a two coating layers to a substrate, as is done by reference coating system 10. This application of two layers via a single coating station is done by exploiting three extra degrees of freedom inherent in the system 30.

First, the direction of movement of substrate is reversible, including the direction of the passage of the substrate through the transfer lock 34. Second, the coating zone 42 is configured such that it can implement the requisite processes for the application of different coating layers to the substrates. This is possible because the coating zone 42 of the multi-pass coating system 30 can change gas flow and/or vapor flow rates and ETP source power on time scales that are short in comparison to substrate transit times through the coating system 30. Third, the heating elements of the heating zone 40, e.g. quartz lamps, can be switched on and off on a similarly rapid time scale.

As seen from the above, the multi-pass coating system 30 of FIG. 2 generally applies the desired coating layers by subjecting each substrate to the following sequence of events:

(1) transferring a substrate into the coating system 30 via the transfer lock 34;
(2) traversing the heating zone 40, with heaters on, towards the take-up module 44;
(3) traversing coating zone 42 where a first coating layer is applied while moving towards the take-up module 44,
(4) entering the take-up module 44 while generally moving away from transfer lock 34;
(5) exiting the take-up module 44, while generally moving towards transfer lock 34;
(6) traversing the coating zone 42 for a second time while applying a second coating layer to the substrate;
(7) traversing the heating zone 40, optionally with the heaters off, moving towards transfer lock 34; and
(8) transferring from the coated substrate through the transfer lock 34 from inside to outside the coating system 30.

The sequence of heating and coating treatments applied to the substrate via the multi-pass coating system 30 of FIG. 2 is nominally the same as the sequence applied in the reference coating system 10 of FIG. 1. However, the differences between these two different coating systems have the potential to cause subtle differences in the effective treatment of the substrates, unless the multi-pass coating system 30 accounts for these differences as discussed below.

First, the time delay between applications of individual sub-layers is likely to be longer in the multi-pass coating system 30. This increased time delay may cause the substrate temperature to be lower during application of the second layer. Actively heating the substrate in the take-up module 44 could readily compensate for this heat loss if needed.

Second, in the multi-pass coating system 30, a fully-coated substrate traverses the heating zone 40 on its way back through the coating system 30. This is step (7) described above. Even with the heaters (e.g. quartz lamps heaters) switched off, the walls of the heating zone 40 may still radiate heat and elevate the temperature of the coated substrate. This elevated temperature could potentially result in thermal damage to the coated substrate. Active cooling (e.g. water cooling) of the walls in the heating zone 40, and elsewhere in the coating system 30, may be desirable to eliminate this concern. Additionally, other walls or components of the multi-pass coating system 30 may absorb and re-radiate excess heat since the substrates (and the thermal energy they carry) are removed less frequently from the present system than from the reference coating system 10. Such walls or components of the coating system could be similarly compensated with active cooling.

Third, utilization (Um) of the coating zone 42, i.e., the percentage of the time that the coating zone 42 is occupied by a substrate in the multi-pass coating system 30, is much less than unity because each substrate moves into and out of the coating system 30 before the next substrate enters the coating system 30. This leaves the coating zone 42 vacant for most of each cycle through the system 30 by a substrate. If the coating reagent continuously flows during the coating cycle in the coating zone 42, there is the potential for stray coating precursors to contaminate the substrate while it is outside the coating zone. At least two abatement strategies can be employed to alleviate this concern.

One abatement strategy for the above is to purge the heating and buffer modules 40, 38. The purging can be accomplished with the purge 39 using the same inert gas (e.g. argon) 45 that flows through the ETP sources of the coating zone 42. With ports 41 for pumping the process gases out of the coating zone being located close to or within the coating zone 42, the purge gas from the heating and buffer modules 40, 38 will tend to confine the coating precursors to the coating zone 42.

Another abatement strategy is to switch the reagent flow on and off, depending on whether the coating zone is occupied or vacant.

The buffer module 38' adjoining the take-up module 44 also helps to minimize contamination of substrates in the take-up module 44 via stray coating precursors. This is a function that becomes more important in connection with the expanded take-up modules in the embodiments of the present invention described in FIGS. 3 through 5.

The reduced capacity of the multi-pass coating system 30 relative to the reference coating system 10 is readily explained by Equation 1. Using the embodiment shown in FIG. 2 and the reference coating system 10 shown in FIG. 1, the first factor (Zm/SL) in Equation 1 is 0.5. The second factor (Um/Ur) is also less than one because Um is much less than unity, for the reason explained above, and Ur approaches unity in practical cases, per Equation 2. Assuming Um equal to about 0.2, which is a practical and realistic value, Equation 1 yields a nominal capacity for the multi-pass coating system 30 that is about 10% of the capacity of the reference coating system 10. Um, and in turn the capacity of a multi-pass coating system 30, can be increased significantly by coating a group or series of substrates, instead of a single substrate, in each cycle of operation. The coating of a group or series of substrates is performed in the embodiments described in FIGS. 3 through 5, which will now be described below.

Referring now to FIG. 3, seen therein is a further embodiment of a multi-pass coating system 230 embodying the principles of the present invention, which provides significantly greater capacity than the embodiment previously described with reference to FIG. 2. This increase in capacity is achieved with only a relatively small increase in the amount of the capital investment. The new feature in FIG. 3, relative to the embodiment of FIG. 2, is the expansion of the take-up module 244 so as to be able to accommodate a group of "N" substrates, where "N" refers to a number greater than one (N>1). Since the other modules of this embodiment are substantially the same as the embodiment of FIG. 2, these modules retain the same reference numerals as use in connection with the prior embodiment.

The take-up module 244 takes in substrates via a transfer mechanism, one at a time, until it holds the entire group of "N" substrates. The take-up module 244 then dispenses all "N" substrates, one at a time, back into the buffer zone 38' leading to the coating zone 42. It is a matter of engineering discretion whether the "N" substrates within the take-up module 244 are stacked as in a deck of playing cards, fanned out as in a rotatable carousel, or arranged in some other fashion, as known to those skilled-in-the-art. Accordingly, the take-up module 244 comprises a cassette mechanism (not shown), or similar mechanism, for sequentially aligning a slot of the cassette mechanism for receiving and dispensing each of the substrates. It is preferred that the cassette mechanism takes up and dispenses substrates on a first-in-first-out (FIFO) basis. This ensures that each substrate experiences the same time period between the application of successive coating layers. Otherwise, the system 230 operates with the same general process outlined in connection with FIG. 2.

The capital investment required for the embodiment of the multi-pass coating system 230 seen in FIG. 3 is higher than for the embodiment of the coating system 30 seen in FIG. 2. This is due to the larger take-up module 244, along with its cassette mechanism. In other respects, however, the coating system embodiments described in FIGS. 2 and 3 are generally the same. It will therefore be appreciated that the difference in investment between the two systems 30, 230 would be only a small fraction of the total investment for the coating system of either embodiment.

The greater capacity offered by the multi-pass coating system 230 seen in FIG. 3 is due to the higher utilization, Um, of its coating zone 42. With the coating system 30 of the first embodiment, the coating zone 42 is occupied by only one substrate at a time. Idle (unoccupied) periods for the coating zone 42 of the first embodiment occur after a substrate leaves the coating zone 42 en route to the take-up module and while it is reversing its direction in the take-up module 44 and moving back towards the coating zone 42, as well as when a coated substrate is being exchanged for an uncoated substrate via the transfer lock 34.

In the embodiment of FIG. 3, all N substrates move continuously through the coating zone 42 in the same direction. An idle period does not occur until all of the substrates have passed through the coating zone 42. While the duration of the idle period is essentially independent of N, the idle period occurs less frequently as N increases because the idle periods are interrupted by increasingly longer periods of active coating time. Thus, the utilization Um increases as N increases. At the limit where N is very large, Um can approach Ur, but this occurs at the expense of the system's footprint and investment, since the scale and complexity of the take-up module also will increase with N. When N equals 5, a practical value for Um is 0.5. Equation 1 then yields a nominal capacity for the multi-pass coating system 230 as being about 25% of the capacity of the reference coating system 10. This is significantly higher than the estimate of 10% for the first embodiment of the multi-pass coating system, namely system 30 described in connection with FIG. 2.

FIG. 4 illustrates a third embodiment of a multi-pass coating system 330 where the transfer lock 334, in addition to the take-up module 244, is configured such that it too can accommodate a group of N substrates by means of a cassette mechanism, as previously described. Relative to the second embodiment, this expansion of the transfer lock 334 is the new feature of this third embodiment. As with the take-up module of FIG. 3, substrates move between the cassette mechanism of the transfer lock 334, through the coating zone 42, toward the take-up module 244 and back again, so that both sides of each substrate are available for coating during each pass through the coating zone 42. Between the transfer lock 334 and the outside world, the N substrates may be transferred as a group or individually. In either case, all N substrates are transferred during the same cycle. Otherwise, the system 330 operates in the same manner as described in connection with the prior embodiments.

While the embodiment of the multi-pass coating system 230 seen in FIG. 3 can only apply two layers to the substrates, the embodiment seen in FIG. 4 can apply more than two layers to the substrates, but when applying only two layers, the latter embodiment does not offer additional capacity over the embodiment of FIG. 3 for the incremental capital investment that is associated with the expansion of the transfer lock 334 of FIG. 4. However, the construction of the multi-pass coating system 330 seen in FIG. 4 may be preferable when there is a need for coating more than two layers on the substrate. When there is a need for more than two layers, the single coating zone 42 implements all of the layers of the coating. When applying more than two layers to the substrate, the expanded transfer lock 334 operates as a take-up module, again reversing the direction of the N substrates for a third traversal through the coating zone 42. When an odd number of layers is to be applied, the coating zone 42 of FIG. 4 is operated such that during one of the traversals through the coating zone 42, such as the last traversal, a layer is not applied to the substrates as they pass therethrough. In such instances, it may be preferable that the take-up module 244 be replaced with a module that serves as both a transfer lock and take-up module, such as an additional modified transfer lock 334. This is illustrated in FIG. 5.

The coating system 430 of this fourth embodiment (FIG. 5) avoids the extraneous and time-consuming final pass through an idle coating zone. Such an idle traversal would be required by the embodiment in FIG. 4, during the application of an odd number of coating layers, just to convey the substrates back to the single transfer lock 334 that functions for both intake and out-take of the substrates.

If the coating processes for all of the sub-layers are mutually compatible, in the sense that they all can be implemented in a common coating zone, then the embodiments of the multi-pass coating systems 30, 230, 330, 430 that comprise a single coating zone 42 (such as those seen in FIGS. 2 through 5), serve the objective of lowering capital investment when compared to the investment required by the reference coating system 10. If minimum investment is the definitive criteria, the embodiment of FIG. 2 is preferred. If criteria such as capacity, and investment per unit of capacity, are on par with overall investment costs, then one of the embodiments of FIGS. 3-5 may be preferred, depending on the particular application. For example, the multi-pass coating system 230 of FIG. 3 might be preferred for the application of a coating comprising two layers. Similarly, the multi-pass coating system 330 of FIG. 4 may be preferred for applications where the substrate will receive an even number of coating layers. The multi-pass coating system 430 of FIG. 5 might be more preferred for applications where a substrate is coated with an odd number of layers.

If coating processes for two or more layers cannot be implemented in a common coating zone 42, because of the potential for cross-contamination for example, then a multi-pass coating system embodying the principles of the present invention may comprise more than one coating zone 42. In this construction, any mutually compatible processes are preferably implemented in only one coating zone so that the multi-pass coating system still comprises fewer coating zones 42 than a reference coating system 10 that can apply the same number of coating layers. The preferred configuration of transfer locks and take-up modules, however, will depend on a weighting of investment and capacity criteria, as before, but would also be dependent on the specific coating layers that are to be applied to the substrates.

Although it offers no major advantages over the various configurations of the multi-pass coating systems seen in FIGS. 2-5, a hybrid multi-pass coating system 630 is illustrated in FIG. 6. Unlike the reference system 10, the hybrid coating system 630 comprises fewer coating zones 42 than the number of coating layers to be applied to the substrate. The hybrid coating system 630 applies multiple coating layers to substrates via a single coating zone 42, presuming that the various coating layers are mutually compatible. In the hybrid coating system 630, the substrates make multiple passes through the coating zone, as with the prior embodiments, but all passes are always in the same direction, as in the reference coating system 10. Reversals of direction are avoided by including two transfer locks 34, 34' on opposing ends of the system 630 and by providing for the return of substrates from the output side of the coating zone 42, back to the input side of the coating zone 42, via an independent path through a recirculation module 648. Without reversals of direction of the substrates, there is no capacity benefit to using expanded transfer locks in place of standard transfer locks.

In the hybrid coating system 630, the single coating zone 42 applies all of the coating layers to the substrates in a repetitive sequence, e.g., A, B, C, A, B. C, etc. Substrates may continuously enter the coating zone 42 with various numbers of coating layers or sub-layers, that number of coating layers being less than the desired number of coating layers. The substrates being recirculated to the coating zone 42 are then sequenced through the coating zone 42 according to the next layer that each substrate requires, and are coordinated with the process sequence so that each substrate traversing the coating zone 42 receives the appropriate coating layer. With the construction of FIG. 6, for a coating comprised of X layers, a partially coated substrate exiting the coating zone 42 is diverted by a splitter module 650 X−1 times back to the input side of the coating zone 42, via the recirculation module 648. At this point, the substrates merge, in a merge module 652, with the uncoated substrates that have been newly transferred into the system 630 by the intake transfer lock 34. Fully-coated substrates, those with all of desired coating layers, exit the coating zone 42 and are advanced to an out-take transfer lock 34', at a rate equal that is equal to the rate at which new uncoated substrates enter into the system 630 via the intake transfer lock 34.

To maintain the sequence of substrates described above, substrates pass through the intake transfer lock 34 at a nominal rate that is equal to the rate of transfer in the reference coating system 10, divided by X. Actual transfer rates in the hybrid coating system 630 will be less than this nominal rate, however, because the gap between successive substrates would in practice be greater in the hybrid coating system 630 than in the reference coating system 10. This greater gap allows for adjustment and stabilization of the coating process in the coating zone 42 after each substrate passes therethrough and before the next substrate is at a location where it can be coated. In the reference coating system 10, substrates can be spaced as close as the transport mechanism allows because each coating zone only implements a single coating process, which is continuously done. As with the reference coating system 10, substrates move through the coating zone 42 of the hybrid multi-pass coating system 630 continuously, and therefore the utilization (Uh) of the hybrid system 630, relative to utilization (Ur) for the reference coating system 10, is expressed by Equation 3, $$Uh/Ur=(L+Gr)/(L+Gh) \quad \text{(Eq. 3)}$$

where Gh is the gap between successive substrates in the hybrid coating system 630, and L and Gr are defined the same as in Equation 2. In practice, Gh would tend to become larger the more dissimilar the processes for successive layers. This is a result of the longer time period needed to stabilize for the next coating process. For example, with Gr being a very small fraction of L and with Gh being equal to L, Uh is about 0.5 times Ur. If a multi-pass coating system (such as those seen in FIGS. 3-5) achieves comparable utilization, then such multi-pass coating system may be preferable on practical grounds to that of system 630. The mechanical complexity of part transport might be considered comparable between the systems, with large cassette mechanisms being required in one case and recirculation, splitter, and merge modules being required in the other. However, the hybrid coating system 630 involves the extra complexity and material inefficiency of switching coating layer processes after each substrate traverses the coating zone 42, whereas in the multi-pass coating systems of the previously discussed embodiments, this switch occurs after N substrates traverse the coating zone.

It will be appreciated that the remaining modules and zones of the hybrid coating system 630 operate generally the same as in the prior embodiments.

The preceding description of the preferred embodiments is merely exemplary in nature and is in no way intended to limit the invention or its application or uses. A person skilled-in-the-art will recognize from the above description that modifications and changes can be made to the preferred embodiments without departing from the scope and fair meaning of the invention, as defined in the following claims.

The invention claimed is:

1. A method for coating substrates with multiple coating layers, the method comprising:
   establishing a sub-atmospheric pressure within a coating system;
   transferring each substrate from outside the coating system to inside the coating system though a transfer lock;
   moving each substrate through a heating zone prior to entering a coating zone;
   traversing the coating zone in a first direction of movement and applying a first coating layer to each substrate in the coating zone using expanding thermal plasma enhanced chemical vapor deposition;
   traversing the coating zone a second time and applying a second coating layer to each substrate in the coating zone using expanding thermal plasma enhanced chemical vapor deposition; and
   transferring each substrate from inside the coating system to outside the system through the transfer lock; and
   purging the heating zone with inert gas when the coating zone is vacant; and
   pumping the inert gas out of the coating zone through ports located in the coating zone.

2. The method of claim 1, wherein the coating system has one coating zone.

3. The method of claim 1, wherein the step of traversing the coating zone a second time is performed in a second direction of movement, the second direction of movement being different than the first direction of movement.

4. The method of claim 1, further comprising the step of reversing the direction of movement of the substrates through the system.

5. The method of claim 4, wherein the reversing step includes receiving and holding a plurality of substrates and then dispensing the substrates in the second direction.

6. The method of claim 1, wherein multiple substrates are moved through the system simultaneously.

7. The method of claim 1, further comprising the step of traversing the coating zone more than two times and applying more than two coating layers onto the substrates.

8. The method of claim 7, wherein the step of traversing the coating zone more than two times includes traversing the coating zone at least one time without applying a corresponding coating to the substrates.

9. The method of claim 8, wherein the step of traversing the coating zone a second time is performed in a second direction of movement, the second direction of movement being different than the first direction of movement.

10. The method of claim 9, wherein the second direction of movement is opposite in direction to the first direction of movement.

11. The method of claim 1, further comprising, prior to coating the substrate, heating each substrate in the heating zone to a temperature suitable for coating.

12. A method for coating substrates with multiple coating layers, comprising:
   establishing a sub-atmospheric pressure within a coating system;
   transferring each substrate from outside the coating system to inside the coating system though a transfer lock;
   heating each substrate in a heating zone before entering a coating zone;
   traversing the coating zone in a first direction of movement and applying a first coating layer to each substrate in the coating zone using expanding thermal plasma enhanced chemical vapor deposition;
   traversing the coating zone a second time and applying a second coating layer to each substrate in the coating zone using expanding thermal plasma enhanced chemical vapor deposition;
   determining if the coating zone is occupied or vacant;
   if the coating zone is vacant, purging a heating zone with inert gas; and
   pumping the inert gas out of the coating zone through ports located in the coating zone.

13. The method of claim 12, wherein the coating system has one coating zone.

* * * * *